(12) United States Patent
Tanabe

(10) Patent No.: US 6,947,321 B2
(45) Date of Patent: Sep. 20, 2005

(54) ORGANIC THIN-FILM SWITCHING MEMORY DEVICE AND MEMORY DEVICE

(75) Inventor: Takahisa Tanabe, Tsurugashima (JP)

(73) Assignee: Pioneer Corporation, Tokyo (JP)

( * ) Notice: Subject to any disclaimer, the term of this patent is extended or adjusted under 35 U.S.C. 154(b) by 0 days.

(21) Appl. No.: 10/616,501

(22) Filed: Jul. 10, 2003

(65) Prior Publication Data

US 2004/0057323 A1 Mar. 25, 2004

(30) Foreign Application Priority Data

Jul. 12, 2002 (JP) .......................... 2002-204102

(51) Int. Cl.$^7$ .............................................. G11C 11/34

(52) U.S. Cl. ...................... 365/174; 365/175; 365/154

(58) Field of Search ................................ 365/174, 175, 365/154; 257/40

(56) References Cited

U.S. PATENT DOCUMENTS

| 6,055,180 A | 4/2000 | Gudesen et al. ............ 365/175 |
| 6,646,912 B2 * | 11/2003 | Hurst et al. .................. 365/175 |
| 6,683,322 B2 * | 1/2004 | Jackson et al. ............... 257/40 |

FOREIGN PATENT DOCUMENTS

| JP | 8-116109 | 5/1996 |
| JP | 2001-516964 | 10/2001 |

* cited by examiner

Primary Examiner—Anh Phung
Assistant Examiner—Pho M. Luu
(74) Attorney, Agent, or Firm—Morgan Lewis & Bockius LLP (57) ABSTRACT

An organic switching memory device includes a plurality of first electrode lines; an organic memory layer formed on the plurality of first electrode lines, the organic memory layer having a voltage-current hysteresis characteristic; a semiconductor diode layer stacked on the organic memory layer; and a plurality of second electrode lines formed on the semiconductor diode layer, the plurality of second electrode lines being disposed in a direction so as to intersect the plurality of first electrode lines.

6 Claims, 11 Drawing Sheets

ORGANIC THIN-FILM SWITCHING MEMORY DEVICE AND MEMORY DEVICE

BACKGROUND OF THE INVENTION

1. Field of the Invention

The present invention relates to an organic switching memory device that permits writing and rewriting and in which organic material is employed, and to a memory apparatus or the like having the memory device.

2. Description of the Related Art

In recent years, research and development has vigorously pursued developing functional devices or electronic elements employing organic material. Examples of conventional memory devices employing organic materials include, for example, a mask ROM (Read Only Memory) that utilizes an organic diode as disclosed by Japanese Patent Kohyo No. 2001-516964. Because the memory device does not permit electrical writing, the use of the memory device is limited to a mask ROM and the memory element cannot therefore be applied to a memory device that is capable of performing electrical writing or rewriting operations.

Furthermore, examples of other memory devices include the memory device disclosed by Japanese Patent Kokai No. 08-116109. The memory device utilizes a material which changes in resistance in accordance with the application of a voltage and retains the resistance value even upon removal of the application voltage. Although such a memory device must be combined with a switching element for increasing the capacity of a memory device, a straightforward method has not been proposed in which the characteristics of the organic material are utilized.

SUMMARY OF THE INVENTION

The prior art has therefore been confronted by a problem such that it is difficult to implement a large-capacity organic memory device and a memory apparatus that permits electrical writing or rewriting in a high-performance organic memory device or memory apparatus. The problem mentioned above is cited as one example of the problems which the present invention is intended to resolve.

According to the present invention, there is provided an organic switching memory device, which comprises a plurality of first electrode lines; an organic memory layer formed on the plurality of first electrode lines, the organic memory layer exhibiting a voltage-current hysteresis characteristic; a semiconductor diode layer stacked on the organic memory layer; and a plurality of second electrode lines formed on the semiconductor diode layer, the plurality of second electrode lines being disposed in a direction so as to intersect the plurality of first electrode lines.

Further, according to the present invention, there is provided a memory apparatus which comprises a organic switching memory device having a plurality of first electrode lines, an organic memory layer formed on the plurality of first electrode lines, the organic memory layer exhibiting a voltage-current hysteresis characteristic; a semiconductor diode layer stacked on the organic memory layer; and a plurality of second electrode lines formed on the semiconductor diode layer, the plurality of second electrode lines being disposed in a direction so as to intersect the plurality of first electrode lines, a receiver section for receiving an address designation signal, data and a write command signal, the address designation signal designating addresses which correspond to intersecting positions of the plurality of first electrode lines and the plurality of second electrode lines, and a control section which writes the data to the organic switching memory device on the basis of the address designation signal, in response to the write command signal.

DETAILED DESCRIPTION OF THE INVENTION

Embodiments of the present invention will now be described in detail with reference to the drawings. In the figures which are referenced in the following description, the same reference numerals are assigned to the constituent elements which are substantially equivalent.

First Embodiment

Figure 1:
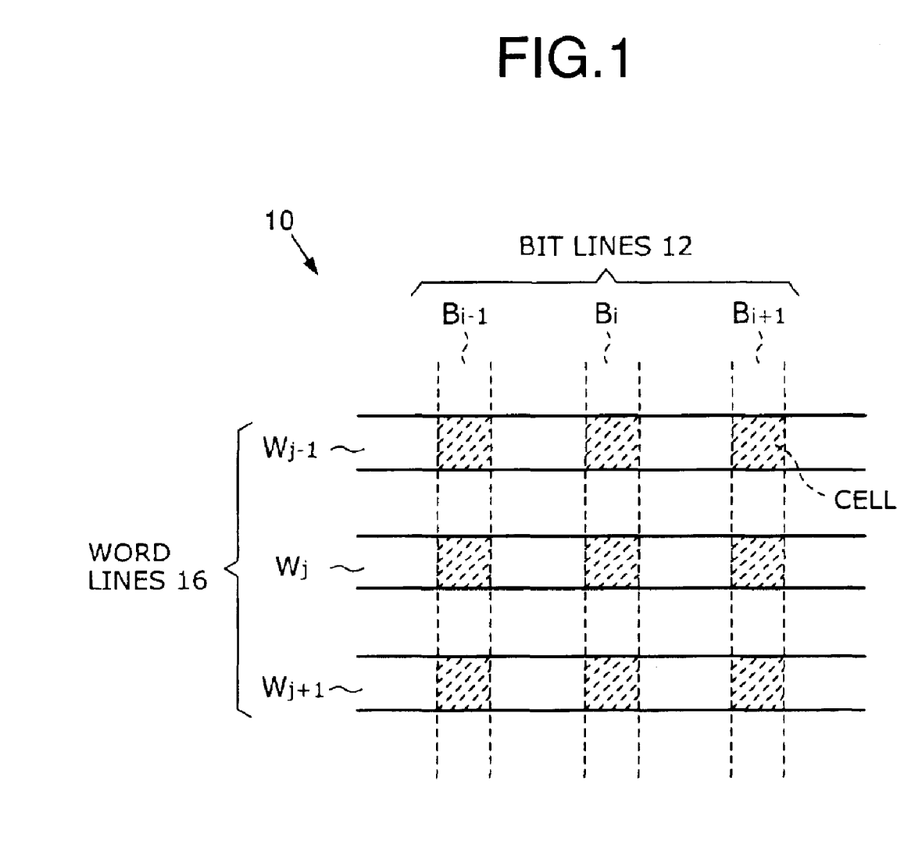
FIG. 1 is a plan view of part of a memory device according to the first embodiment of the present invention.
Figure 2:
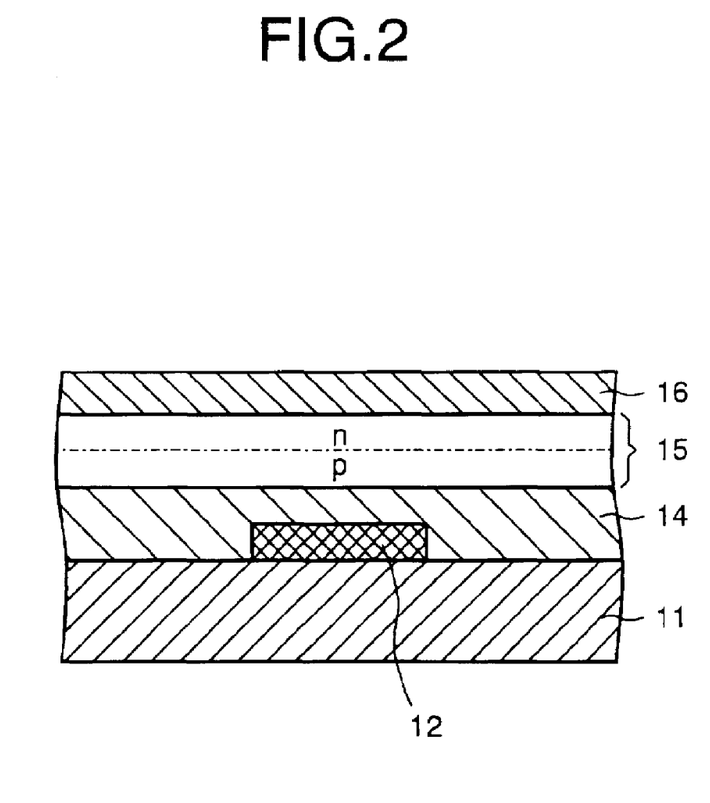
FIG. 2 is a cross-sectional view of a region which comprises a memory cell portion of the memory device shown in FIG. 1.

FIG. 1 is a plan view of part of a memory device 10 according to a first embodiment of the present invention, and FIG. 2 is a cross-sectional view of a region that comprises a memory cell portion of the memory device 10 shown in FIG. 1. As shown in FIG. 1, the memory device 10 is constituted by stacking, on a substrate 11, a lower electrode (hereinafter, also referred to as bit lines Bi) 12, a memory layer 14, a semiconductor layer 15, and an upper electrode (hereinafter, also referred to as word lines Wj) 16, in this order.

In more detail, the substrate 11 is constituted by alkali-free glass, for example. A plurality of first electrode lines made of a gold (Au) metal layer or other metal layer, that is, bit lines Bi (i=1, 2, . . . m), are arranged in the form of mutually parallel stripes or strips on the substrate 11. The memory layer 14 is formed by an organic memory material such as zinc phthalocyanine (ZnPc) or zinc phthalocyanine porphyrin, for example. The semiconductor layer 15 is a p-n junction organic semiconductor diode in which copper phthalocyanine is used as the p-type material and a perylene derivative is used as the n-type material, for example. The p-type organic semiconductor layer is connected to the memory layer 14 and the n-type organic semiconductor layer is connected to the upper electrode 16 described hereinafter.

A plurality of second electrode lines provided by a metal such as aluminum (Al), that is, stripe-shaped word lines Wj (j=1, 2, . . . n), are arranged on the semiconductor layer 15 so as to be mutually parallel and lie in a direction that sterically intersects bit lines Bi, in a direction orthogonal to bit lines Bi, for example. An ohmic contact is formed between the upper electrode (word lines Wj) 16 and the semiconductor layer 15 (n-type organic semiconductor layer).

The lower electrode (bit lines Bi) 12, the memory layer 14, the semiconductor layer 15 and the upper electrode (word lines Wj) 16 are formed by means of vacuum vapor deposition.

According to the above-mentioned configuration, memory cells C(j,i) are formed in the regions of intersections between the word lines Wj and the bit lines Bi. More particularly, each of the memory cells C(j,i) has a structure in which the word line (Wj) 16, the semiconductor layer (diode junction) 15, the memory layer 14 and the bit line (Bi) 12 are connected in series. Further, the memory cells C(j,i) are arranged in the form of a matrix. As will be described later, the memory cells C(j,i) serve as switching memory composite elements.

Figure 3:
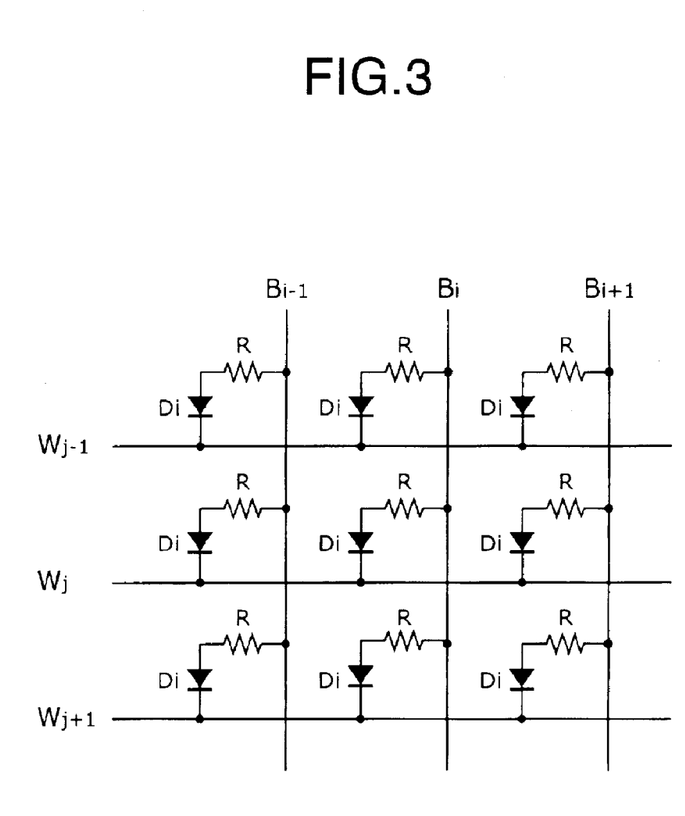
FIG. 3 corresponds to FIG. 1 and shows an electrical equivalent circuit for part of the memory device.

FIG. 3 corresponds to FIG. 1 and shows an electrical equivalent circuit corresponding to a part of the memory device 10. In the equivalent circuit, the diodes Di corresponds to the diode junction of the semiconductor layer 15 and the resistors R corresponds to the memory layer 14 (FIG. 2). Each of the memory cells C(j,i) can be represented as a serial connection of the diode Di and the resistor R.

Figure 4:
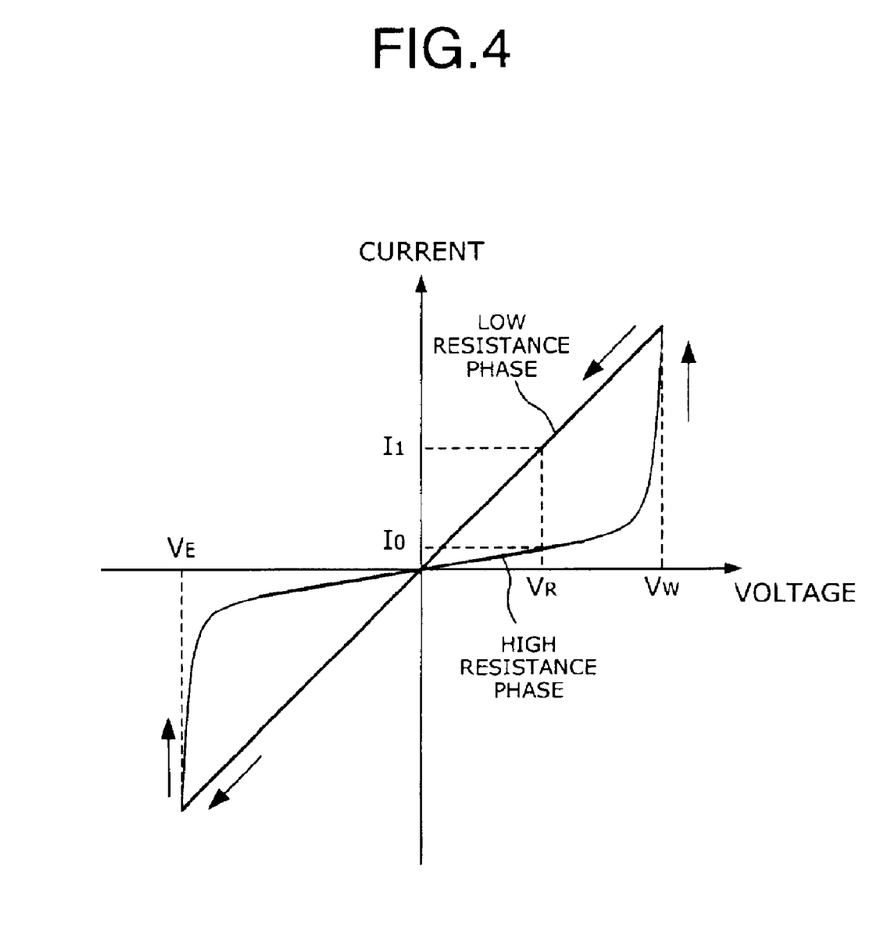
FIG. 4 shows an example of the current-voltage characteristic (I-V characteristic) of the organic memory material employed for the memory layer.

FIG. 4 shows an example of the current-voltage characteristic (I-V characteristic) of the organic memory material (zinc phthalocyanine: ZnPc) employed for the memory layer 14. Such an organic memory material exhibits a hysteresis loop characteristic. More particularly, when the memory material is in a high-resistance phase state (reset state), the current value increases in accordance with the resistance value of the high-resistance phase region as the voltage applied to the memory material is increased. As the application voltage approaches $V_W$, the current value starts to increase rapidly, and the memory material makes a phase transition to a low resistance phase when the application voltage reaches $+V_W$ ($V_W>0$). Further, the current value decreases in accordance with the resistance value in the low resistance phase region as the application voltage is decreased from the transition voltage $V_W$. When the application voltage is reduced further and the application voltage reaches $-V_E$ ($V_E>0$), the current value increases abruptly and the memory material makes the phase transition to a high resistance phase. It should be noted that a case is illustrated, for brevity of the description, in which the current value varies substantially linearly in the high resistance phase region and the low resistance phase region. However, a memory material may also be used that has an I-V hysteresis characteristic such that current variations have the form of a curve.

As described above, the memory material makes the phase transition to the low resistance phase by an application of a voltage that is equal to or greater than $+V_W$ ($V_W>0$), and makes the phase transition to the high resistance phase by an application of a voltage that is equal to or less than $-V_E$ ($V_E>0$). Therefore, writing of binary data can be performed by varying the voltage which is applied to the memory cells through the use of the I-V characteristic of the memory material. Furthermore, as shown in FIG. 4, the data thus written can be read out by applying a voltage $V_R$ that lies between $-V_E$ and $+V_W$ to the memory device or cell to detect the difference in the electric current values (that is, for example, I0 and I1).

Figure 5:
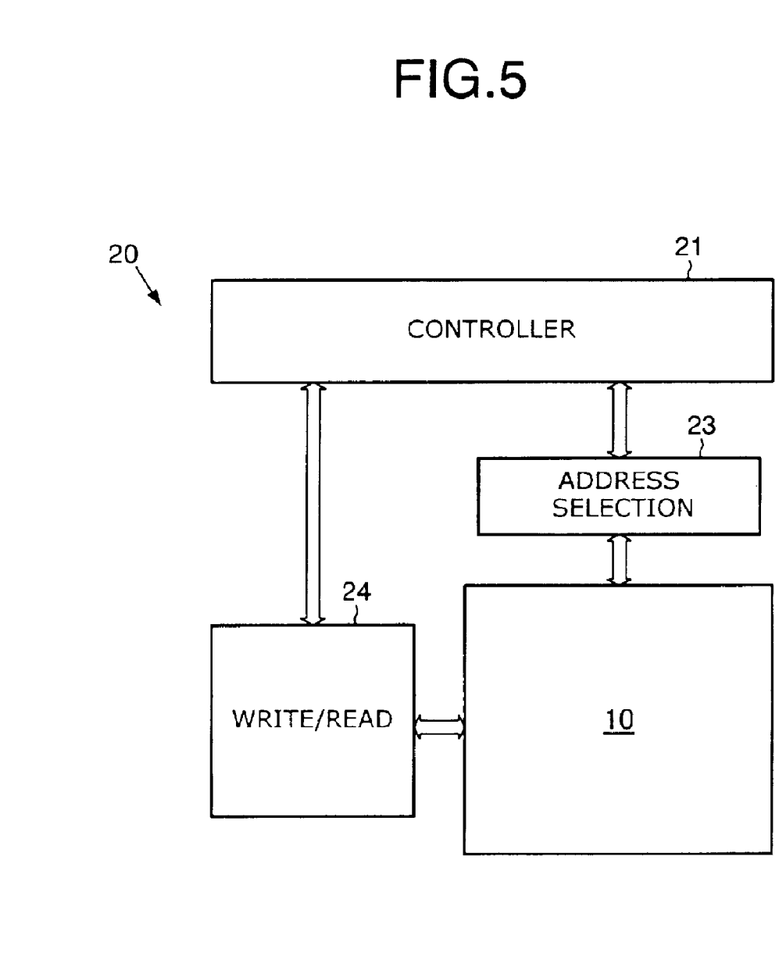
FIG. 5 shows the configuration of a memory device that uses the memory device.

FIG. 5 shows the configuration of a memory apparatus 20 that uses a memory device 10. The memory apparatus 20 comprises a memory device 10, which includes the above-mentioned matrix memory array, a controller 21, an address selection circuit 23, and a write/read control circuit (hereinafter, simply referred to as a 'write/read circuit') 24. Address designation signals are supplied from the controller 21 to the address selection circuit 23, and a write control signal or a read control signal is supplied from the controller 21 to the write/read circuit 24. The address selection circuit 23 may include an address register (not shown). The write/read circuit 24 may include a write register/read register (not shown). The controller 21 performs writing to the memory device 10 on the basis of external data and control signals or on the basis of control signals and data which are generated internally, and outputs data read out from the memory device 10. Further, the controller 21 performs an erase operation and a total reset operation of written data to the memory cells.

In addition, the memory device 20 may include circuits for providing an increased speed or increased functionality such as an error correction circuit, a refresh circuit, and a buffer circuit. Further, the controller 21 need not be provided as a separate circuit as shown in FIG. 5. Also, a configuration is also possible in which the apparatus does not include the controller 21. In such an apparatus, the address selection circuit 23 and the write/read circuit 24 are configured to operate in accordance with commands supplied via a data bus or the like from an external processor such as a microprocessor (CPU), for example so as to perform the write/read and erase operations of the memory device 10.

A detailed description is provided below with reference to the drawings with regards to the principles of the write, read and erase operations of the memory device 10. Further, for the purpose of simplifying the description, the assumption is made that all of the memory cells C(j,i) are reset to "0" (logic value) when a write operation is performed. Here, the high resistance phase and the low resistance phase correspond to "0" and "1" (logic values), respectively.

A case in which data is written to the memory device 10 a word at a time (i.e., word-by-word) will be described by way of example. More particularly, the voltage of a word line for performing a write operation is set to $-V_L$ ($V_L>0$), and a voltage $V_1$ ($V_1>0$) is applied to cells to be written with "1", and a voltage $V_0$ ($V_0>0$) is applied to cells to be written with "0". In this instance, the voltages $V_1$ and $V_0$ are set so that $V_1-V_L>V_W$, and $V_0-V_L<V_W$. Further, a voltage (0V in the present embodiment) is applied to the word lines which are not to undergo writing, the voltage being sufficiently high in order to avoid a phase transition as a result of the application of the voltage $V_1$. Alternatively, the word lines which are not to undergo writing may be held at a high impedance.

Figure 6:
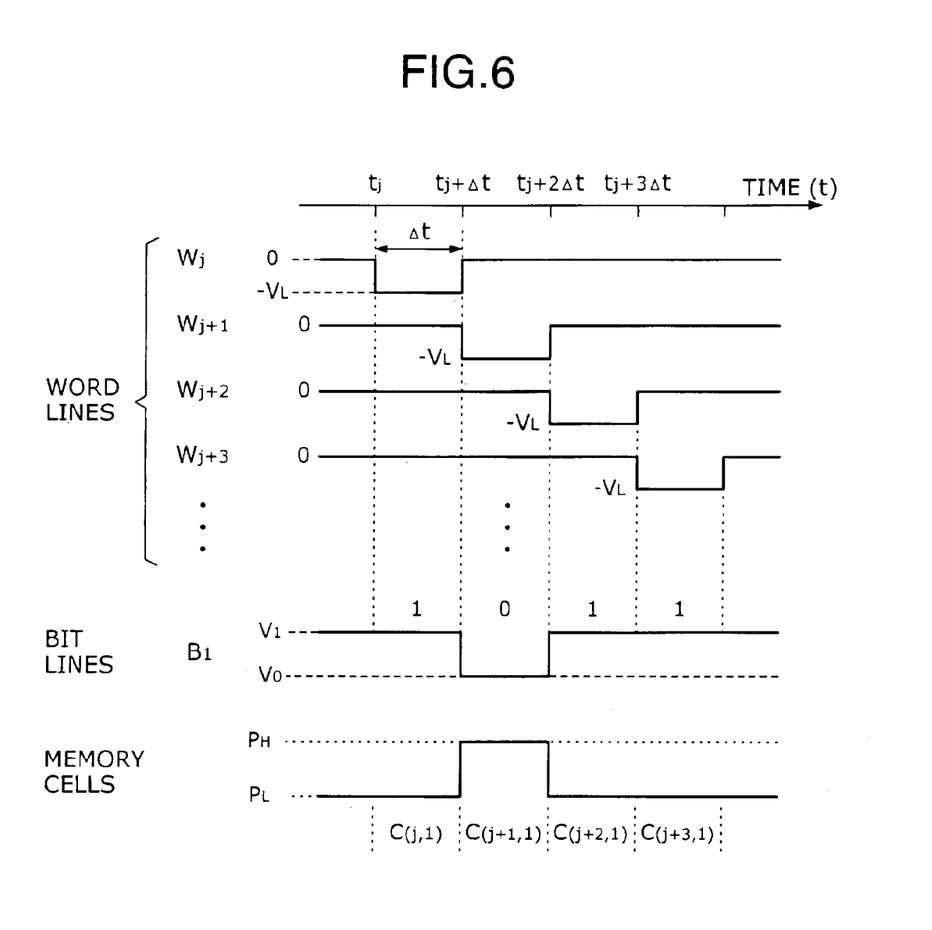
FIG. 6 is a time chart that serves to illustrate the procedure for a case where data is written to the memory device a word at a time.
Figure 7:
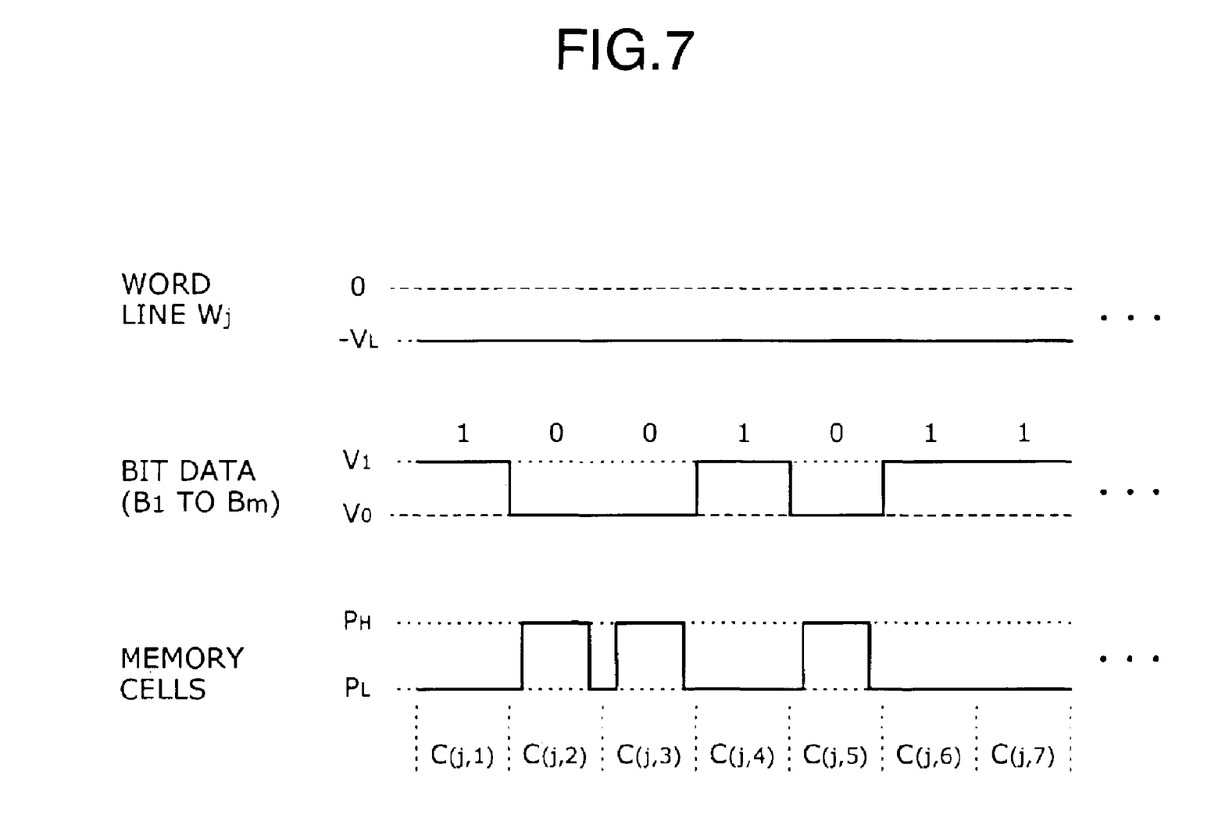
FIG. 7 schematically shows bit data (B1–Bm) written to a word line Wj when a voltage $-V_L$ is applied to the word line Wj at a time $t_j$, as well as the states of the memory cells.

More specifically, as shown in FIG. 6, the voltage $-V_L$ is applied to the j-th word line (Wj) which is to undergo writing at time $t_j$. The application of the voltage to the word line (Wj) takes place during the period Δt. In this instance, the voltage $V_1$ or $V_0$ is applied in correspondence with each bit of the bit data to be written to the bit lines Bi (i=1, 2, ... m). FIG. 7 schematically illustrates the bit data (B1 to Bm) to be written to the word line (Wj), as well as the states of the memory cells (hereinafter, referred to as the resistance phases). For example, when the bit data which is to be written to the word line (Wj) is "1001011 ...", the voltage $V_1$ is applied to B1, B4, B6 and B7 and the voltage $V_0$ is applied to B2, B3, and B5, since B1, B4, B6 and B7 correspond to a logic value of "1" and B2, B3, and B5 correspond to "0". As described above, the cells to which the voltage $V_1$ is applied make a phase transition from a high resistance phase ($P_H$) to a low resistance phase ($P_L$). Further, the cells to which the voltage $V_0$ is applied retain a high resistance phase ($P_H$) since no phase transition takes place by the application of the voltage $V_0$. Accordingly, the memory cells C(j i) on the word line Wj (where i=1, 2, 3, ... ), have resistance phases "LHHLHLL ... " in correspondence with the bit data (here, $P_H$ is denoted by "H", and $P_L$ is denoted by "L").

Then, as shown in FIG. 6, the application voltage for the word line $W_j$ at time $t_j+\Delta t$ is made 0V, and the voltage $-V_L$ is applied to the next word line $W_{j+1}$ during the period Δt. The voltage $V_1$ or $V_0$ is applied to the bit lines Bi (i=1, 2, ... m) in accordance with each bit of the bit data to be written to the cells on the word line $W_{j+1}$. As a result, in a similar manner as described above, the cells C(j+1,i) (where i=1, 2, 3, ... m) on the word line $W_{j+1}$ have resistance phases in accordance with the bit data. Data is also written to word lines $W_{j+2}$ and beyond for each word in a similar manner.

Figure 8:
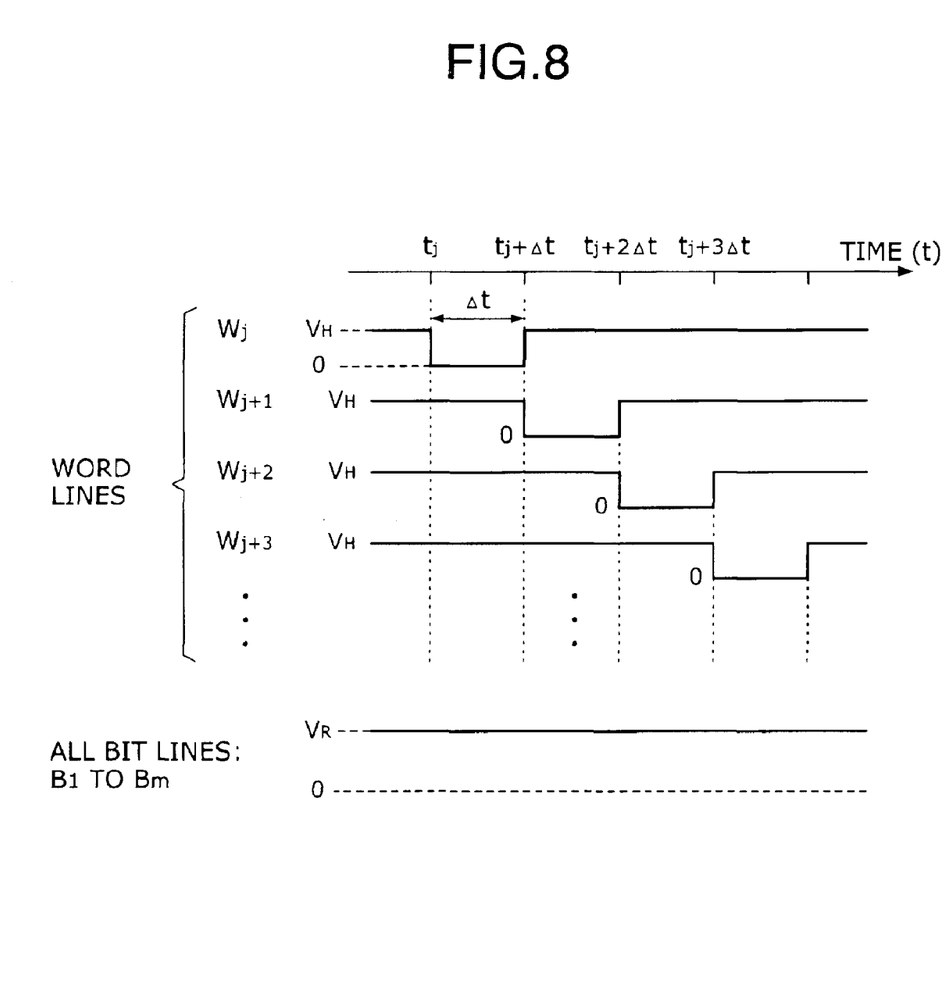
FIG. 8 is a time chart that serves to illustrate the procedure in a case where data is read out from the memory device a word at a time.

A description will be provided next for the procedure for reading out data from the memory device 10 for each word. More particularly, as shown in FIG. 8, a read voltage $V_R$ is applied to all of the bit lines (B1–Bm). Further, a voltage $V_H$ that is equal to or more than $V_R$ is applied to the word lines. Alternatively, the word lines may be set at a high impedance. Also, as shown in FIG. 4, the read voltage $V_R$ is set to be a voltage so as not to cause a phase transition, that is, a voltage between the phase transition voltage $+V_W$ and 0V ($0<V_R<+V_W$). In this condition, the voltage of the word line (Wj) to be read out is changed to be 0V, whereby the respective values of the current flowing in the memory cells C(j+1,i) (where i=1, 2, 3 ... m) are detected. The written bit data can be read out by discriminating the resistance phase of each cell (that is, the high resistance phase or the low resistance phase thereof) from the current values. Similarly to a case in which data is written, desired data can be read out by sequentially scanning the word lines at 0V.

Figure 9:
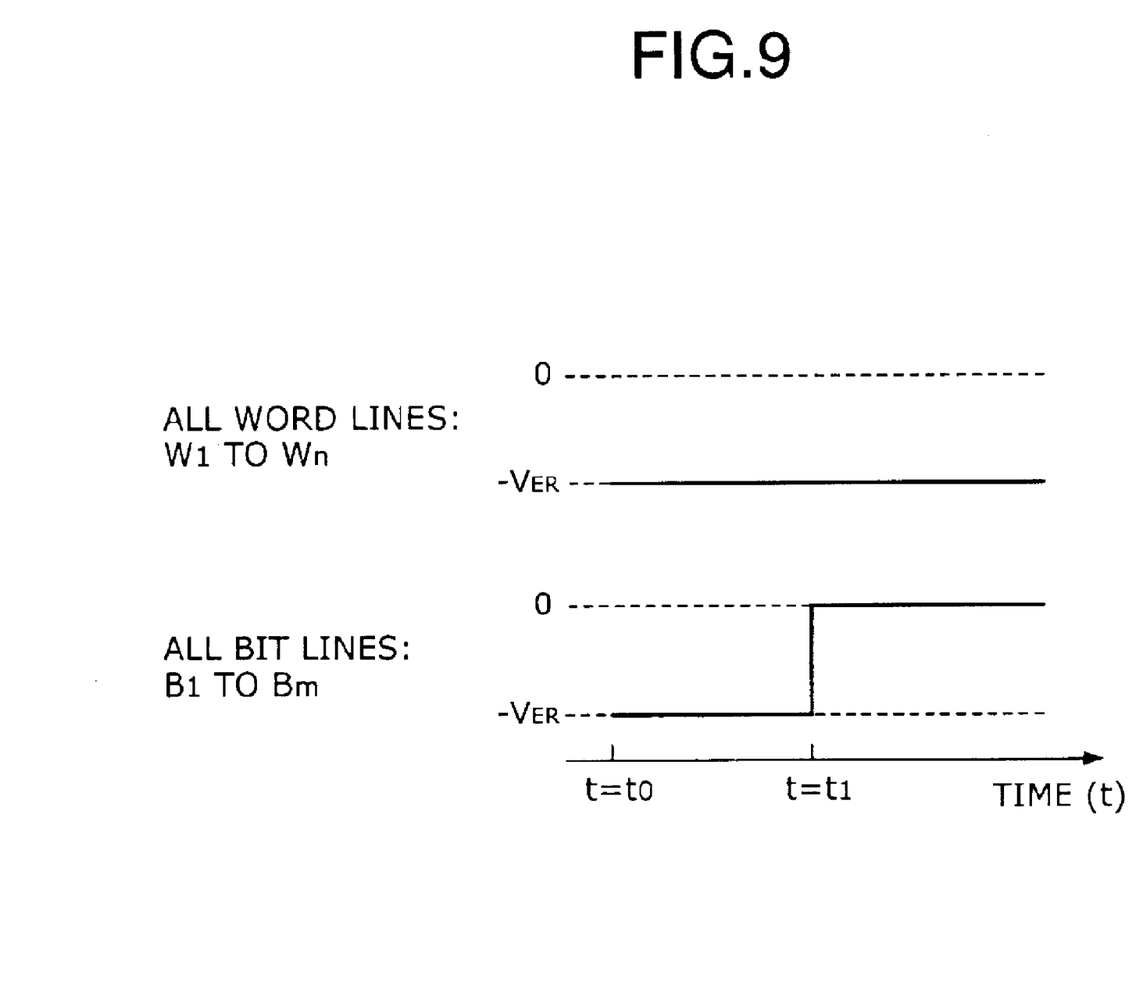
FIG. 9 is a time chart that serves to illustrate the procedure in a case where the contents of all of the memory cells are erased (reset)

A description will be provided next for the procedure whereby data written to the memory device 10 is erased. Further, a case in which the contents of all of the memory cells are erased (or reset) will be described by way of example. First of all, as shown in FIG. 9, an erase voltage $-V_{ER}$, which is a voltage equal to or less than $-V_E$, is applied to all of the word lines (W1–Wn) and all of the bit lines (B1 to Bm) at time t0. Then, at time t1, the voltage of all of the bit lines (B1 to Bm) is set to 0V. Because a voltage that is equal to or greater than $V_E$ (absolute value) is applied across the memory cells at the instant the voltage of all the bit lines is set to 0V, the memory cells are reset to a high resistance phase irrespective of the state (resistance phase) prior to this erasure. Further, a case in which the contents of all of the memory cells are erased (reset) is described above, however, erasure could also be performed for each word or each cell.

Therefore, as described above, according to the present invention, it is possible to provide a switching memory device that is simple and inexpensive and permits electrical writing and readout, as well as a memory apparatus which employs the memory device.

Second Embodiment

Figure 10:
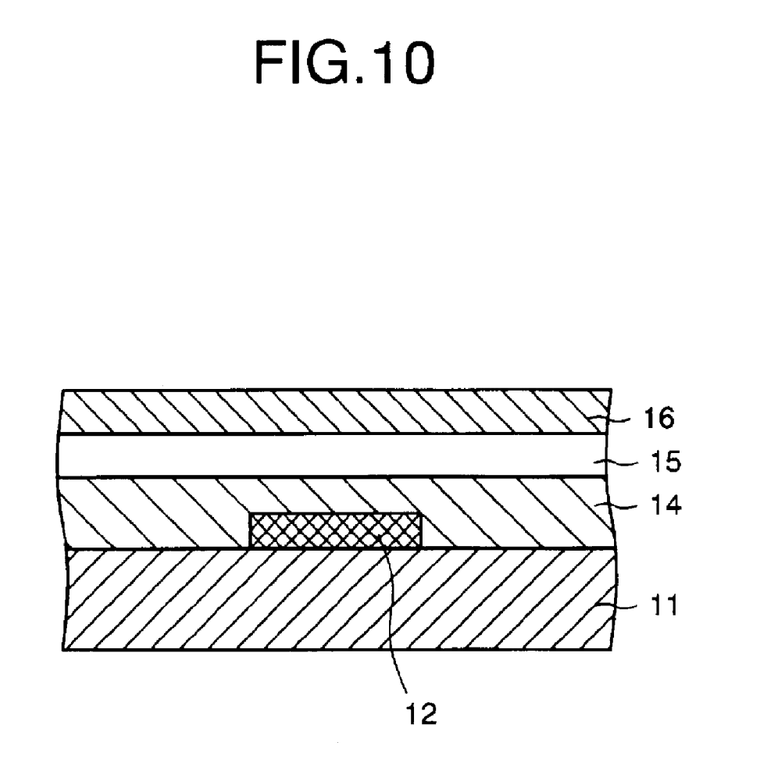
FIG. 10 is a cross-sectional view of a region which comprises a memory cell portion of the memory device according to a second embodiment of the present invention.

FIG. 10 is a cross-sectional view of a region which includes a memory cell portion of the memory device 10 according to a second embodiment of the present invention. The semiconductor layer 15 is formed as a p-type organic semiconductor for which the material used is copper phthalocyanine. A Schottky diode junction is formed at the interface with the semiconductor layer 15 by using a metal having a work function that is smaller than that of copper phthalocyanine, such as aluminum (Al), for example, for the upper electrode (word line Wj) 16. The configuration of the other portions of the memory device 10 is similar as that of the first embodiment.

Similarly to the case of the first embodiment described above, the Schottky diode exhibits a favorable switching characteristic and the cells C(j+1,i) thus operate as switching memory cells.

Third Embodiment

Figure 11:
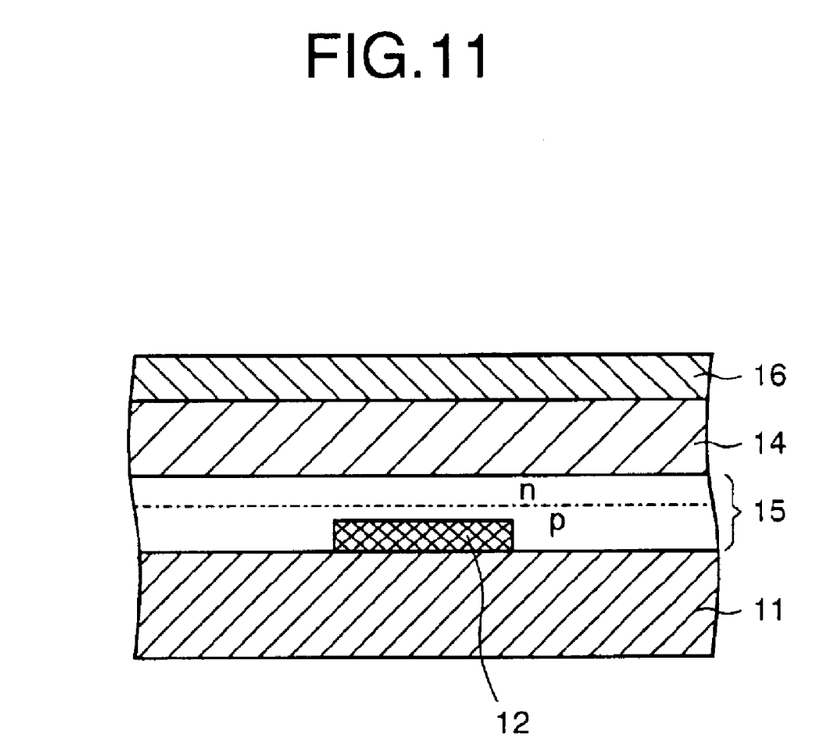
FIG. 11 is a cross-sectional view of a region which comprises a memory cell portion of the memory device according to a third embodiment of the present invention.

FIG. 11 is a cross-sectional view of a region which includes a memory cell portion of the memory device 10 according to a third embodiment of the present invention. In this embodiment, the configuration is produced by changing the position of the memory layer and the semiconductor layer of the first embodiment. More particularly, a bit line 12, a semiconductor layer 15, an organic memory layer 14, and a word line 16 are formed in this order on a substrate 11. Further, in this case, the semiconductor layer 15 is a p-n junction diode, for example, and is constituted such that the p-type semiconductor layer thereof makes contact with the lower electrode (bit line) 12. The configuration is in other respects similar to the first embodiment.

Further, a variety of additional modifications are possible for the above-described first to third embodiments. For example, a configuration is possible in which the word line and bit line are switched. More particularly, the lower electrode on the substrate 11 may constitute the word line, while the upper electrode may constitute the bit line. In addition, the diode polarity could also be the reverse of that of the above embodiment. In this case, the polarity of the application voltage may also be suitably selected in accordance with the polarity of the diode.

Further, the semiconductor layer 15 is not limited to an organic semiconductor. An inorganic semiconductor can also be used. For example, a covalent bond semiconductor such as Si and a compound semiconductor such as GaAs can also be employed.

Also, for example, the substrate 11 is not limited to alkali-free glass. For example, plastics, organic materials and the like can also be employed. More particularly, because an organic material can be formed in a low temperature process, the material can be formed on a variety of substrates and the above configuration can therefore be implemented by means of a combination of a variety of materials.

The first and second electrode lines need not be made of metal alone. The first and second electrode lines may be transparent electrodes made of an organic material or an ITO film (indium tin oxide film) or similar.

In addition, a variety of materials other than the above-mentioned phthalocyanine materials can be employed for the memory layer 14. The memory layer 14 can be formed by a variety of methods depending on the material used. Examples of other materials which can be used for the memory layer 14 include polymer materials such as heteroaromatic polymers such as polythiophene and polypyrrole, polyphenylene polymers, polyaniline polymers, and polyacetylene polymers. Usage is not restricted to polymer materials, it also being possible to employ low molecular materials such as pentacene, tetracene, and anthracene. Further, the diode layer 15 can be formed using a material like that for the memory layer 14.

In addition, a case in which the organic memory layer 14 and the organic semiconductor layer 15 are formed by vacuum deposition is described by way of example, but formation is not restricted to such a method. A variety of other deposition methods for organic materials can also be used. For example, methods which can be employed include the Langmuir-Blodgett (LB) method, molecular self-assembly, molecular beam epitaxy (MBE), casting, spinning, melting, field polymerization, plasma polymerization, and the like.

Further, as the n-type (donor) dopant of the semiconductor layer 15, an alkali metal such as sodium (Na), potassium (K), and alkyl ammonium and the like can be used. Further, in cases where the semiconductor layer 15 is constituted by a p-type organic semiconductor, a variety of substances can be employed as the p-type (acceptor) dopant, such as halogens, Lewis acid, protic acid, transition metal chlorides, and the like.

Furthermore, so-called polymer dopants can be used as the dopant in addition to the above-mentioned dopants. For example, a polymer electrolyte such as polystyrene sulfonate and polyvinyl sulfonate can be used.

As methods for doping the above-mentioned organic materials, a variety of methods can be employed such as gas phase and liquid phase doping and electrochemical doping and the like. Alternatively, ion implantation, which involves accelerating ionized dopant by means of an electric field to inject the dopant into organic material, and induced doping, which employs light and radiation to perform doping, can be used.

The invention has been described with reference to the preferred embodiments thereof. It should be understood by those skilled in the art that a variety of alterations and modifications may be made from the embodiments described above. It is therefore contemplated that the appended claims encompass all such alterations and modifications.

This application is based on Japanese Patent Application No.2002-204102 which is hereby incorporated by reference.

What is claimed is:

1. An organic switching memory device, comprising:
    a plurality of first electrode lines formed directly on a substrate;
    an organic memory layer formed on said plurality of first electrode lines, said organic memory layer having a voltage-current hysteresis characteristic;
    a semiconductor diode layer stacked on said organic memory layer; and
    a plurality of second electrode lines formed on said semiconductor diode layer, said plurality of second electrode lines being disposed in a direction so as to intersect said plurality of first electrode lines.

2. The organic switching memory device according to claim 1, wherein said semiconductor diode layer is a pn-junction diode layer.

3. The organic switching memory device according to claim 1, wherein said semiconductor diode layer is a Schottky diode layer.

4. An organic switching memory device according to claim 1, wherein said semiconductor diode layer is an organic semiconductor diode layer.

5. A memory apparatus, comprising:
    a organic switching memory device including:
        a plurality of first electrode lines;
        an organic memory layer formed on said plurality of first electrode lines, said organic memory layer having a voltage-current hysteresis characteristic;
        a semiconductor diode layer stacked on said organic memory layer; and
        a plurality of second electrode lines formed on said semiconductor diode layer, said plurality of second electrode lines being disposed in a direction so as to intersect said plurality of first electrode lines,
    a receiver section for receiving an address designation signal, data and a write command signal, said address designation signal designating addresses which correspond to intersecting positions of said plurality of first electrode lines and said plurality of second electrode lines, and
    a control section which writes the data to said organic switching memory device on the basis of the address designation signal, in response to the write command signal.

6. The memory apparatus according to claim 5, wherein:
said receiver section receives a read command signal, and
said control section reads out data from said organic switching memory device on the basis of said address designation signal, in response to said read command signal.

* * * * *